United States Patent
Ohba et al.

(10) Patent No.: US 9,113,582 B2
(45) Date of Patent: Aug. 18, 2015

(54) AIR CONDITIONING CONTROL APPARATUS AND AIR CONDITIONING CONTROL METHOD

(75) Inventors: Yuji Ohba, Kawasaki (JP); Junichi Ishimine, Kawasaki (JP); Ikuro Nagamatsu, Kawasaki (JP); Masahiro Suzuki, Kawasaki (JP); Tadashi Katsui, Kawasaki (JP); Nobuyoshi Yamaoka, Kawasaki (JP); Akira Ueda, Kawasaki (JP); Yasushi Uraki, Kawasaki (JP); Seiichi Saito, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1114 days.

(21) Appl. No.: 12/781,258

(22) Filed: May 17, 2010

(65) Prior Publication Data

US 2010/0298997 A1    Nov. 25, 2010

(30) Foreign Application Priority Data

May 19, 2009    (JP) ................................ 2009-121432

(51) Int. Cl.
*H05K 7/20* (2006.01)
*G05D 23/19* (2006.01)

(52) U.S. Cl.
CPC ............ *H05K 7/20836* (2013.01); *G05D 23/19* (2013.01)

(58) Field of Classification Search
None
See application file for complete search history.

(56) References Cited

U.S. PATENT DOCUMENTS

| 3,555,251 | A | * | 1/1971 | Shavit ........................... 700/286 |
| 5,197,666 | A | | 3/1993 | Wedekind |
| 6,145,328 | A | | 11/2000 | Choi |
| 6,157,897 | A | * | 12/2000 | Yoshikawa .................... 702/132 |
| 6,539,736 | B1 | * | 4/2003 | Isazawa et al. ................ 62/175 |
| 7,472,558 | B1 | * | 1/2009 | Narita ............................. 62/175 |
| 7,596,431 | B1 | * | 9/2009 | Forman et al. ................ 700/299 |
| 2003/0200050 | A1 | | 10/2003 | Sharma |
| 2004/0011066 | A1 | * | 1/2004 | Sugihara et al. ................ 62/177 |

(Continued)

FOREIGN PATENT DOCUMENTS

| JP | 09-042737 | 2/1997 |
| JP | 2004-060978 | 2/2004 |

(Continued)

OTHER PUBLICATIONS

Huneter et al, "Increasing Data Center Energy Efficiency by Monitoring and Targeting to Heating and Cooling Metrics", Trendpoint May 2008.*

(Continued)

*Primary Examiner* — Ryan Jarrett
(74) *Attorney, Agent, or Firm* — Squire Patton Boggs (US) LLP

(57) ABSTRACT

An air conditioning control apparatus for controlling an air conditioner in a room which accommodates a computer, includes obtaining repetitively a detected value of a total power consumption of the computer and the air conditioner and a detected value of a air temperature at the air inlet, storing the obtained values into a memory, determining an approximate expression representing a relation between the total power consumption and the air temperature on the basis of the values stored into the memory, determining a value of the air temperature corresponding to the lowest value of the total power consumption, by using the calculated approximate expression, and controlling the air conditioner so that the air temperature become equal the calculated air temperature.

9 Claims, 10 Drawing Sheets

(56) References Cited

U.S. PATENT DOCUMENTS

| | | | |
|---|---|---|---|
| 2005/0023363 A1* | 2/2005 | Sharma et al. | 236/49.3 |
| 2006/0065750 A1* | 3/2006 | Fairless | 236/46 R |
| 2006/0259621 A1* | 11/2006 | Ranganathan et al. | 709/226 |
| 2007/0078635 A1* | 4/2007 | Rasmussen et al. | 703/1 |
| 2008/0140259 A1* | 6/2008 | Bash et al. | 700/278 |
| 2008/0288193 A1* | 11/2008 | Claassen et al. | 702/61 |
| 2009/0012633 A1* | 1/2009 | Liu et al. | 700/90 |
| 2009/0037002 A1* | 2/2009 | Tateishi | 700/31 |
| 2009/0063122 A1* | 3/2009 | Nasle | 703/18 |
| 2009/0112522 A1* | 4/2009 | Rasmussen | 702/186 |
| 2009/0144568 A1* | 6/2009 | Fung | 713/300 |
| 2009/0205416 A1* | 8/2009 | Campbell et al. | 73/202.5 |
| 2009/0228151 A1* | 9/2009 | Wang et al. | 700/278 |
| 2009/0235097 A1* | 9/2009 | Hamilton et al. | 713/320 |
| 2009/0259345 A1* | 10/2009 | Kato et al. | 700/295 |
| 2009/0327778 A1* | 12/2009 | Shiga et al. | 713/320 |
| 2010/0010688 A1* | 1/2010 | Hunter | 700/300 |
| 2010/0076607 A1* | 3/2010 | Ahmed et al. | 700/276 |
| 2010/0106988 A1* | 4/2010 | Hayashi et al. | 713/320 |
| 2010/0211669 A1* | 8/2010 | Dalgas et al. | 709/224 |
| 2011/0126206 A1* | 5/2011 | Kato et al. | 718/103 |
| 2011/0245981 A1* | 10/2011 | Refai-Ahmed et al. | 700/282 |

FOREIGN PATENT DOCUMENTS

| | | |
|---|---|---|
| JP | 2007-504919 | 2/2006 |
| JP | 2006-118837 | 5/2006 |

OTHER PUBLICATIONS

Raghavendra, Ramya et al, No "Power" Struggles: Coordinated Multi-level Power Management for the Data Center, ASPLOS'08, Mar. 1-5, 2008, Seattle, Washington.*

Ohba, Y. et al. "Improving IDC Cooling and Air Conditioning Efficiency" Fujitsu Scientific & Technical Journal, vol. 45, No. 1, pp. 123-133 Published Jan. 2009 (WayBack Machine Archive.org Apr. 2009).*

Bash, et al. "Dynamic thermal management of air cooled data centers" IEEE/ASME ITHERM, Jun. 2006.*

Tang, Q. et al. "Sensor-Based Fast Thermal Evaluation Model for Energy Efficient High-Performance Datacenters" IEEE Intelligent Sensing and Information Processing ICISIP 2006. pp. 203,208, Oct. 15, 2006-Dec. 18, 2006.*

GB Search Report, Application No. GB1008256.8, Sep. 21, 2010, a total of 3 sheets.

* cited by examiner

AIR CONDITIONING CONTROL APPARATUS AND AIR CONDITIONING CONTROL METHOD

CROSS-REFERENCE TO RELATED APPLICATION

This application is based upon and claims the benefit of priority of the prior Japanese Patent Application No. 2009-121432, filed on 19 May, 2009, the entire contents of which are incorporated herein by reference.

FIELD

The present embodiments relates to an air conditioning control apparatus, an air conditioning control program, and an air conditioning control method.

BACKGROUND

Conventionally, there are techniques related to an air conditioning control apparatus which circulates air in a room such as a datacenter or a machine room in order to cool IT equipments 303A to P such as a computer in the room.

However, in the above air conditioning control apparatus, efficiency of the IT equipments 303A to P in terms of energy consumption has not been considered. Therefore, techniques aiming to improve energy efficiency of an air conditioning control apparatus have been proposed.

For example, a technique has been proposed in which energy efficiency is improved by selecting a sensor considered to be important for determining a target temperature from among a plurality of control temperature sensors (as temperature detectors) installed in a room, setting the target temperature, and controlling an air conditioning adjustment function section such as a compressor and a blower. Also, a technique is proposed in which energy efficiency is improved by comparing an air map prepared in advance with an actually measured air map, and optimally controlling cool air distribution.

Japanese Laid-open Patent Publication No. 2006-118837 and Japanese National Publication of International Patent Application No. 2006-504919 are examples of related art.

However, in the above conventional techniques, there is no technique in which air conditioning is controlled in consideration of both energy efficiency of the air conditioning system and that of the IT equipment, although there is a technique in which efficiency of an air conditioning control apparatus alone is considered to control air conditioning for cooling IT equipment.

Generally, energy efficiency of an air conditioning control apparatus improves as a setting temperature of the air conditioning increases. On the other hand, energy efficiency of IT equipment improves as the setting temperature of the air conditioning decreases. Therefore, in the conventional techniques which focus only on energy efficiency of the air conditioning system, it cannot be said that energy efficiency of the IT equipment is optimized. As described above, at present, it is not possible to control air conditioning while considering energy efficiency of both the air conditioning system and the IT equipment, in other words, while considering energy efficiency of the entire datacenter.

SUMMARY

According to an aspect of the embodiments, an air conditioning control apparatus for controlling an air conditioner in a room which accommodates a computer having an air inlet and having an outlet, the air conditioning control apparatus includes a memory for storing a plurality of values of power consumption and a plurality of values of an air temperature, a first detector for detecting power consumption of the computer, a second detector for detecting power consumption of the air conditioner, a first temperature detector for detecting air temperature at the air inlet, and a processor for obtaining repetitively a detected value of the power consumption by each of the first detector and the second detector and a detected value of the air temperature by the first temperature detector, storing the obtained values into the memory, determining an approximate expression representing a relation between the total power consumption of the computer and the air conditioner and the air temperature on the basis of the values stored into the memory, determining a value of the air temperature at the air inlet corresponding to the lowest value of the total power consumption, by using the calculated approximate expression, and controlling the air conditioner so that the air temperature at the air inlet become equal the calculated air temperature.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Hereinafter, an embodiment of an air conditioning control apparatus, an air conditioning control method, and an air conditioning control program disclosed by the present application will be described in detail with reference to the drawings. Hereinafter, as an air conditioning control apparatus disclosed by the present application, an example of a system constituted by IT equipment a computer monitoring system and an air conditioning control apparatus is used. The technique disclosed by the present application is not limited by an embodiment described below as an embodiment of the air conditioning control apparatus, the air conditioning control method, and the air conditioning control program.

First Embodiment

The air conditioning control apparatus according to the first embodiment generally controls air conditioning in a datacenter 305 where IT equipments 303A to P such as computers or the like is installed. An outline of the air conditioning control apparatus according to the first embodiment will be described below.

A characteristic formula is obtained by approximating total energy consumption in the datacenter 305 (energy consumption by IT equipments 303A to Ps and energy consumption by air conditioners 301A to D) by a predetermined function formula with an intake air temperature taken into IT equipments 303A to P as a variable. By using this characteristic formula, an intake air temperature at which the total energy consumption value becomes minimum value is calculated, and a control value of the air conditioning is set so that the calculated intake air temperature is realized. Hereinafter, the air conditioning control apparatus according to the first embodiment will be specifically described.

[Configuration of Air Conditioning Control Apparatus (First Embodiment)]

Figure 1:
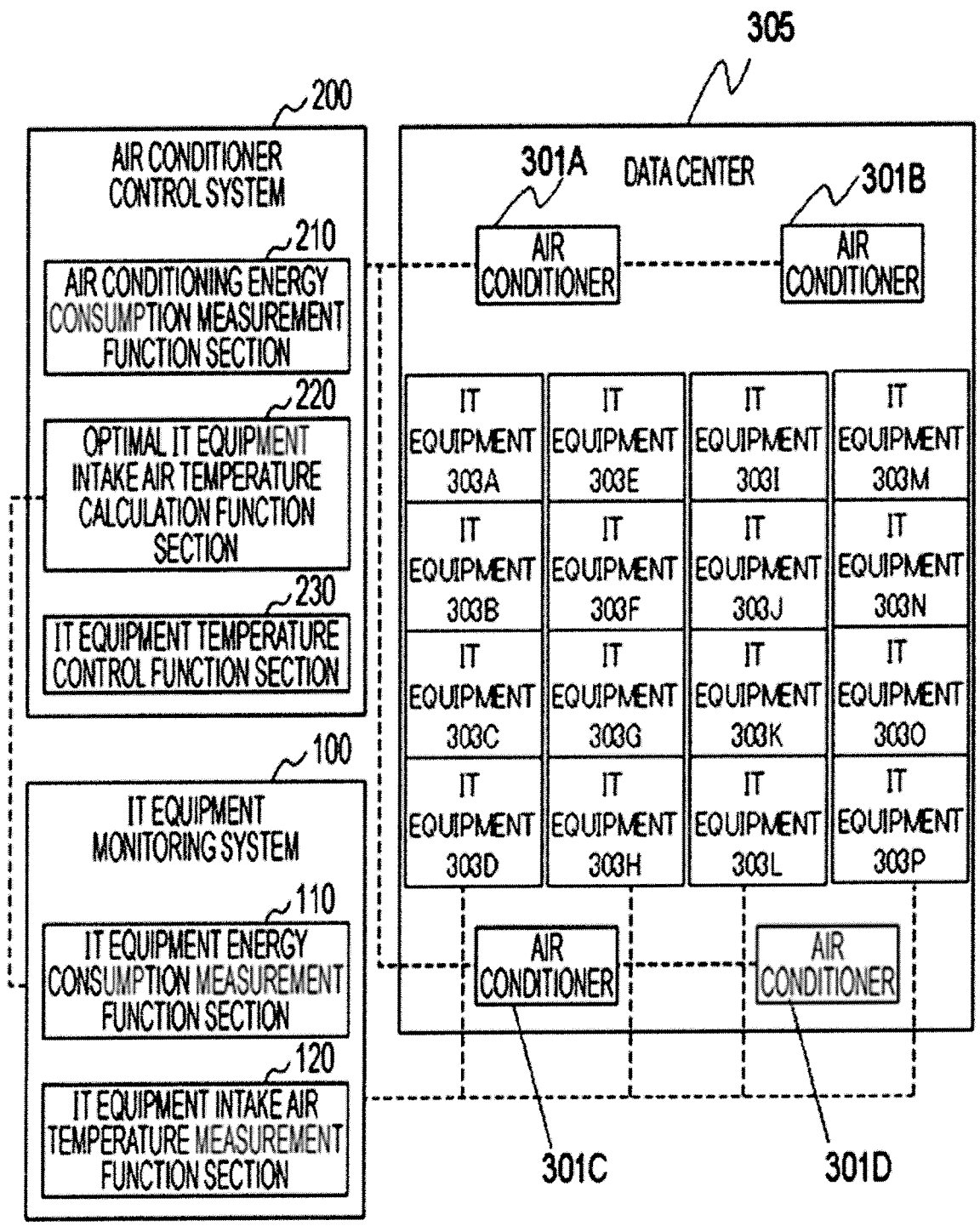
FIG. 1 is a diagram for explaining a configuration of an air conditioning control apparatus according to a first embodiment.

FIG. 1 is a diagram for explaining a configuration of an air conditioning control apparatus according to the first embodiment. As illustrated in FIG. 1, the IT equipments monitoring system 100 monitors IT equipments 303A to P such as computers and a storage installed in a datacenter 305, and includes the IT equipment energy consumption measurement function section 110 and the IT equipment intake air temperature measurement function section 120.

The IT equipment energy consumption measurement function section 110 measures energy consumption of each of IT equipments 303A to P in the datacenter 305. Specifically, the IT equipment energy consumption measurement function section 110 obtains a current value, a voltage value, and the like used by IT equipments 303A to P from detector in UPS (Uninterruptible Power Supply) installed inside each of IT equipments 303A to P in the datacenter 305 at an energy consumption measurement timing. The IT equipment energy consumption measurement function section 110 calculates energy consumption of IT equipments 303A to P from the obtained current value and voltage value, and stores the energy consumption in a storage section included inside the IT equipment energy consumption measurement function section 110 or the like.

The IT equipment intake air temperature measurement function section 120 measures an intake air temperature of each IT equipments 303A to P in the datacenter 305. Specifically, the IT equipment intake air temperature measurement function section 120 obtains an intake air temperature of IT equipments 303A to P from a temperature detectors such as sensors installed in each IT equipments 303A to P in the datacenter 305 at an intake air temperature measurement timing, and stores the obtained intake air temperature in a storage section included inside the IT equipment intake air temperature measurement function section 120 or the like.

The IT equipment energy consumption measurement function section 110 and the IT equipment intake air temperature measurement function section 120 perform measurement processing independently from each other. The same timing is set to the energy consumption measurement timing and the intake air temperature measurement timing in advance, and the energy consumption and the intake air temperature are stored so that the measurement results can be associated with each other.

As illustrated in FIG. 1, the air conditioning control apparatus 200 controls an air conditioners 301A to D installed in the datacenter 305, and includes the air conditioning energy consumption measurement function section 210, the optimal IT equipment intake air temperature calculation function section 220, and the IT equipment temperature control function section 230.

The air conditioning energy consumption measurement function section 210 measures energy consumption of the air conditioners 301A to D installed in the datacenter 305. Specifically, the air conditioning energy consumption measurement function section 210 obtains a current value, a voltage value, and the like used by the air conditioners 301A to D from a detector installed a distribution board having a power supply to the air conditioners 301A to D in the datacenter 305 at an air conditioners 301A to D energy consumption measurement timing. The air conditioning energy consumption measurement function section 210 calculates energy consumption of the air conditioners 301A to D from the obtained current value and voltage value, and stores the energy consumption in a storage section included inside the air conditioning energy consumption measurement function section 210.

The optimal IT equipment intake air temperature calculation function section 220 obtains a characteristic formula which is obtained by approximating total energy consumption (energy consumption by IT equipments 303A to P and energy consumption by air conditioners 301A to D) in the datacenter 305 where the air conditioners 301A to D is installed by a predetermined function formula with an intake air temperature taken into IT equipments 303A to P as a variable, for a certain time period. By using this characteristic formula, an intake air temperature at which the total energy consumption value becomes minimum value is calculated.

Figure 2:
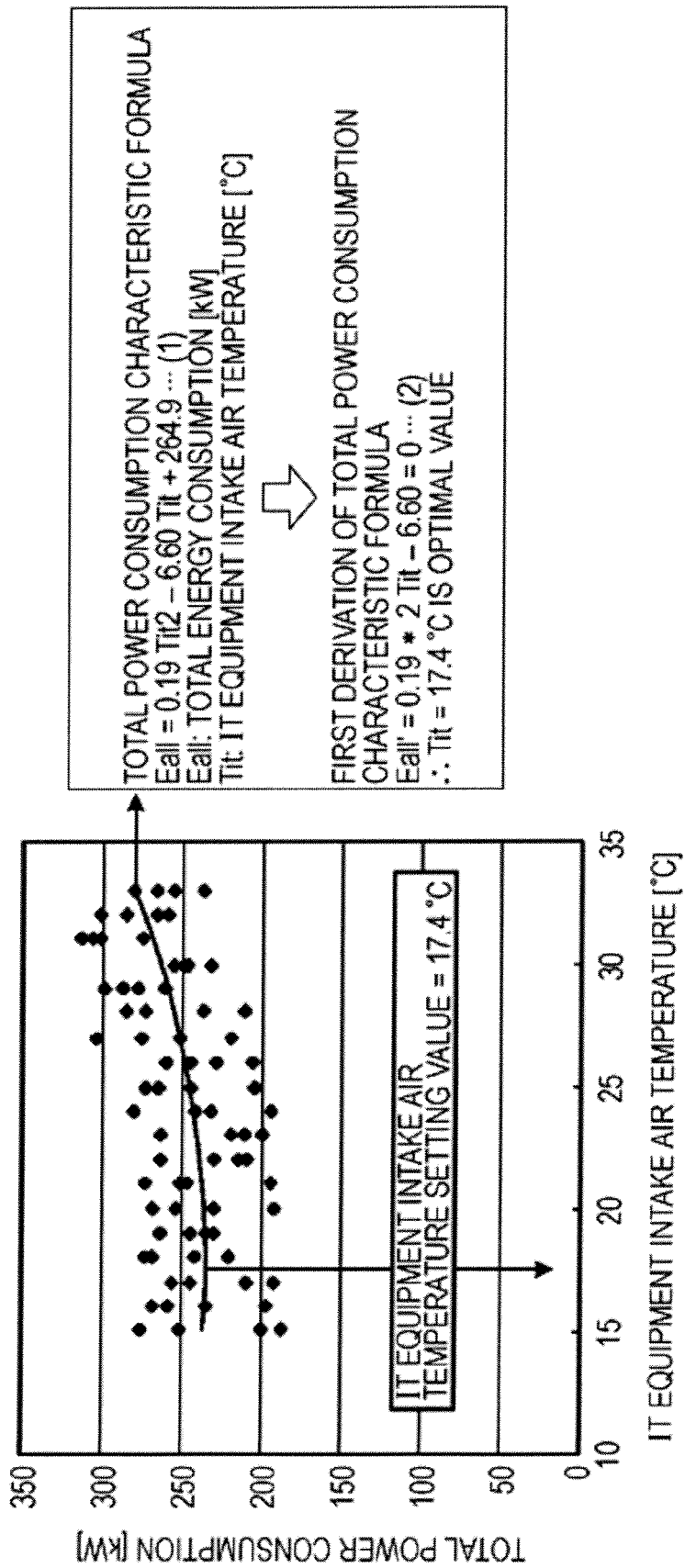
FIG. 2 is a diagram illustrating a relationship between total power consumption (total energy consumption) and temperature of intake air taken into IT equipments 303A to P according to the first embodiment.

For example, as illustrated in FIG. 2, a case in which a quadratic equation having coefficient values "a=0.19, B=−6.60, and c=264.9" and a variable x of intake air temperature "Tit" is employed as a function formula to approximate the total energy consumption will be described below. FIG. 2 is a diagram illustrating a relationship between the total power consumption (total energy consumption) and the temperature of intake air taken into IT equipments 303A to P according to the first embodiment.

In this case, the optimal IT equipment intake air temperature calculation function section 220 can obtain a total power (energy) consumption characteristic formula (1) by approximating the total energy consumption in the datacenter 305 where the air conditioners 301A to D is installed by a quadratic function with an intake air temperature as a variable.

Further, the optimal IT equipment intake air temperature calculation function section 220 can obtain an intake air temperature "Tit=17.4° C." at which the total energy consumption becomes minimum by obtaining a formula (2) that is the first derivative formula of the total power consumption characteristic formula (1) and calculating a minimum value that can be obtained from the formula (2).

The IT equipment temperature control function section 230 updates a control value of the air conditioners 301A to D so that the intake air temperature calculated by the optimal IT equipment intake air temperature calculation function section 220 is realized. For example, in a case illustrated in FIG. 2, the IT equipment temperature control function section 230 updates a control value for adjusting a temperature of cooling-air blown from the air conditioners 301A to D so that the intake air temperature of the IT equipments 303A to P becomes "Tit=17.4° C.".

[Processing of First Embodiment]

FIGS. 3 to 6 are diagrams illustrating a process flow according to the first embodiment. First, measurement processing of energy consumption of the IT equipments 303A to P will be described with reference to FIG. 3.

Figure 3:
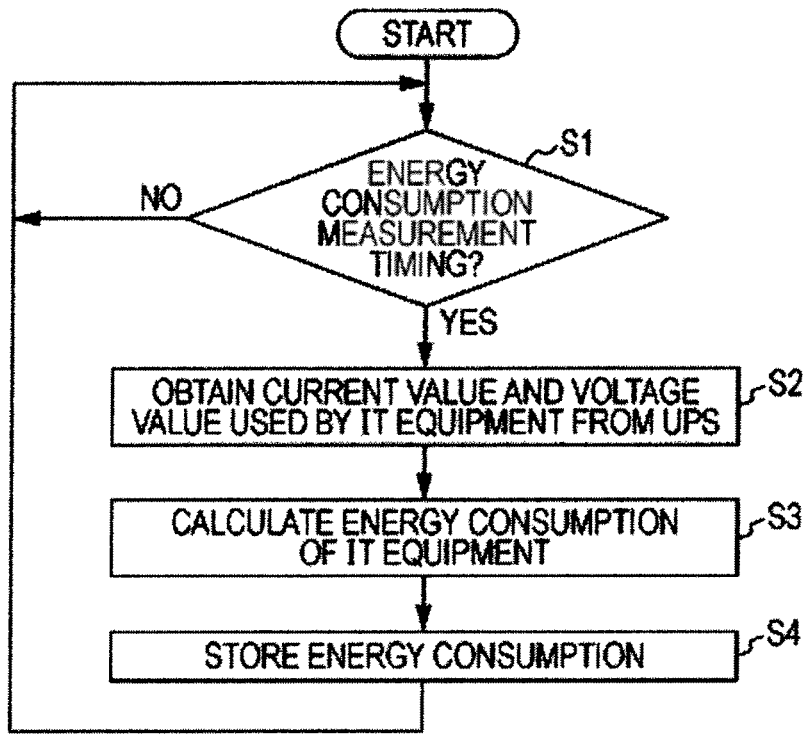
FIGS. 3 to 6 are diagrams illustrating a process flow according to the first embodiment.

As illustrated in FIG. 3, the IT equipment energy consumption measurement function section 110 waits for a timing of measuring energy consumption of the IT the equipment (step S1).

When it reaches the timing of measuring energy consumption (step S1: Yes), the IT equipment energy consumption measurement function section 110 obtains a current value, a voltage value, and the like used by the IT equipments 303A to P from the detector installed the UPS (Uninterruptible Power Supply) installed inside each IT equipments 303A to P in the datacenter 305 (step S2).

The IT equipment energy consumption measurement function section 110 calculates energy consumption of the IT equipments 303A to P from the obtained current value and voltage value (step S3), and stores the energy consumption in a storage section included inside the IT equipment energy consumption measurement function section 110 or the like (step S4).

After storing the energy consumption of the IT equipments 303A to P, the IT equipment energy consumption measurement function section 110 returns again to step S1 described above, and waits for the timing of measuring energy consumption of the IT equipments 303A to P.

When the system is operating, by repeating the above described steps S1 to S4, the IT equipment energy consumption measurement function section 110 performs the measurement of energy consumption of the IT equipments 303A to P.

The timing of measuring energy consumption of the IT equipments 303A to P can be set by a user in advance to an interval such as one-minute interval, three-minute interval.

Figure 4:
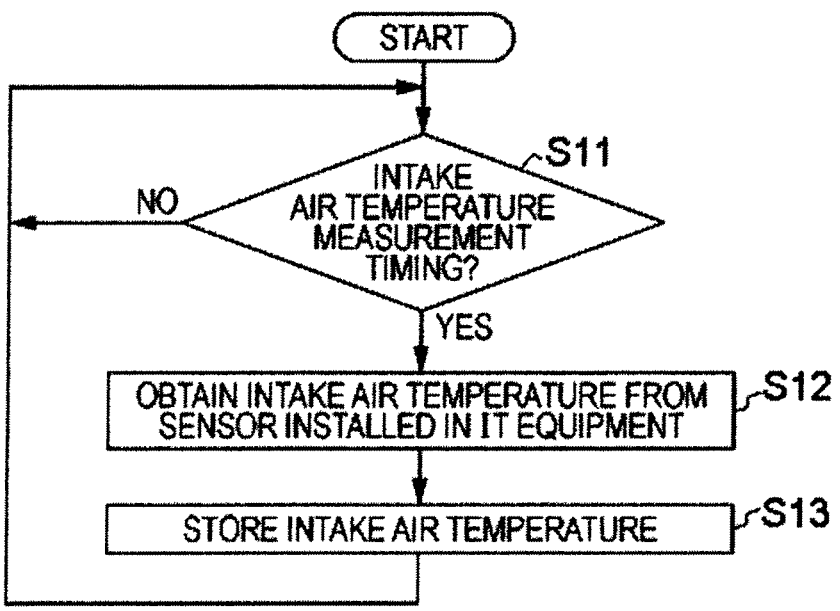

Next, measurement processing of intake air temperature of the IT equipments 303A to P will be described with reference to FIG. 4. As illustrated in FIG. 4, the IT equipment intake air temperature measurement function section 120 waits for a timing of measuring intake air temperature of the IT equipments 303A to P (step S11).

When it reaches the timing of measuring intake air temperature (step S11: Yes), the IT equipment intake air temperature measurement function section 120 obtains an intake air temperature of the IT equipments 303A to P from a sensor installed in each of IT equipments 303A to P in the datacenter 305 (step S12), and stores the obtained intake air temperature in a storage section included inside the IT equipment intake air temperature measurement function section 120 or the like (step S13).

After storing the intake air temperature, the IT equipment intake air temperature measurement function section 120 returns again to step S11 described above, and waits for the timing of measuring intake air temperature of the IT equipments 303A to P.

When the system is operating, by repeating the above described steps S11 to S13, the IT equipment intake air temperature measurement function section 120 performs the measurement of intake air temperature of the IT equipments 303A to P. The timing of measuring intake air temperature of the IT equipments are set to the same as the timing of measuring energy consumption of the IT equipments 303A to P so that the intake air temperature can be associated with the energy consumption of the IT equipments 303A to P.

Figure 5:
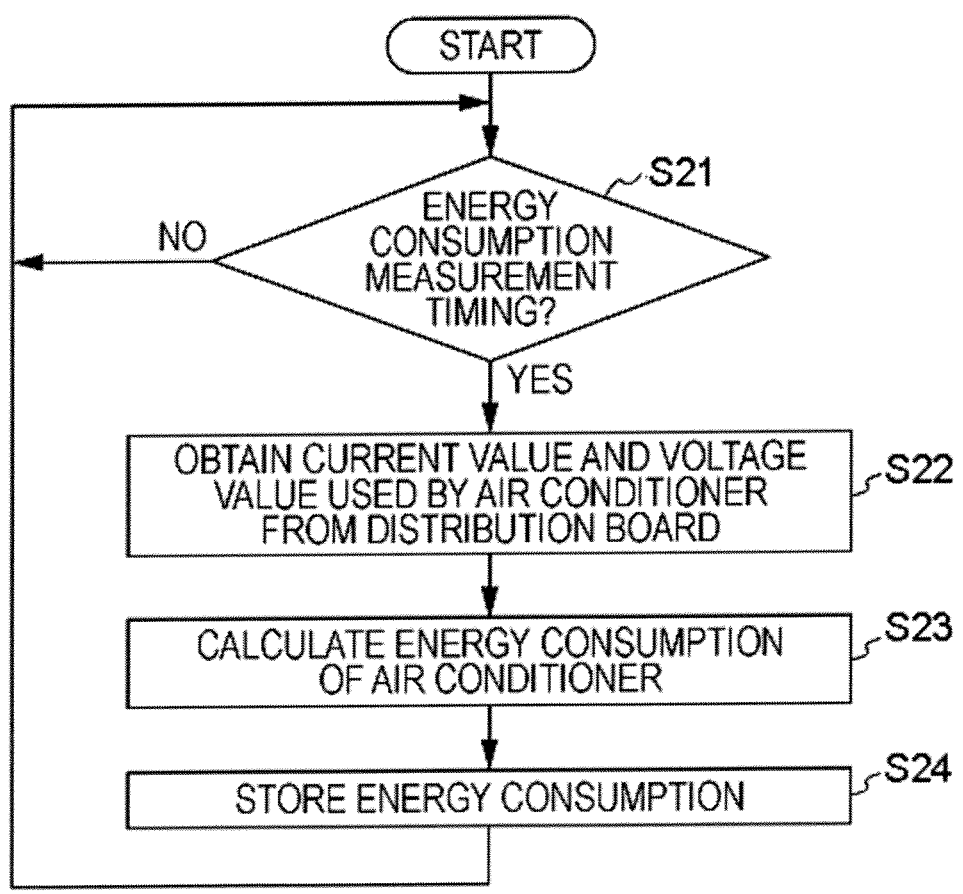

Next, measurement processing of energy consumption of the air conditioners 301A to D will be described with reference to FIG. 5. As illustrated in FIG. 5, the air conditioning energy consumption measurement function section 210 waits for a timing of measuring energy consumption of the air conditioners 301A to D (step S21).

When it reaches the timing of measuring energy consumption of the air conditioners 301A to D (step S21: Yes), the air conditioning energy consumption measurement function section 210 obtains a current value, a voltage value, and the like used by the air conditioners 301A to D from the detector installed the distribution board (step S22).

The air conditioning energy consumption measurement function section 210 calculates energy consumption of the air conditioners 301A to D from the obtained current value and voltage value (step S23), and stores the energy consumption in a storage section included inside the air conditioning energy consumption measurement function section 210 (step S24).

After storing the energy consumption of the air conditioners 301A to D, the air conditioning energy consumption measurement function section 210 returns again to step S21 described above, and waits for the timing of measuring energy consumption of the air conditioners 301A to D.

When the system is operating, by repeating the above described steps S21 to S24, the air conditioning energy consumption measurement function section 210 performs the measurement of energy consumption of the air conditioners 301A to D. The timing of measuring energy consumption of the air conditioners 301A to D is set to the same as the measurement timing of the IT equipment monitoring system 100 so that the energy consumption of the air conditioners 301A to D can be associated with the measurement result of the IT equipment monitoring system 100.

Figure 6:
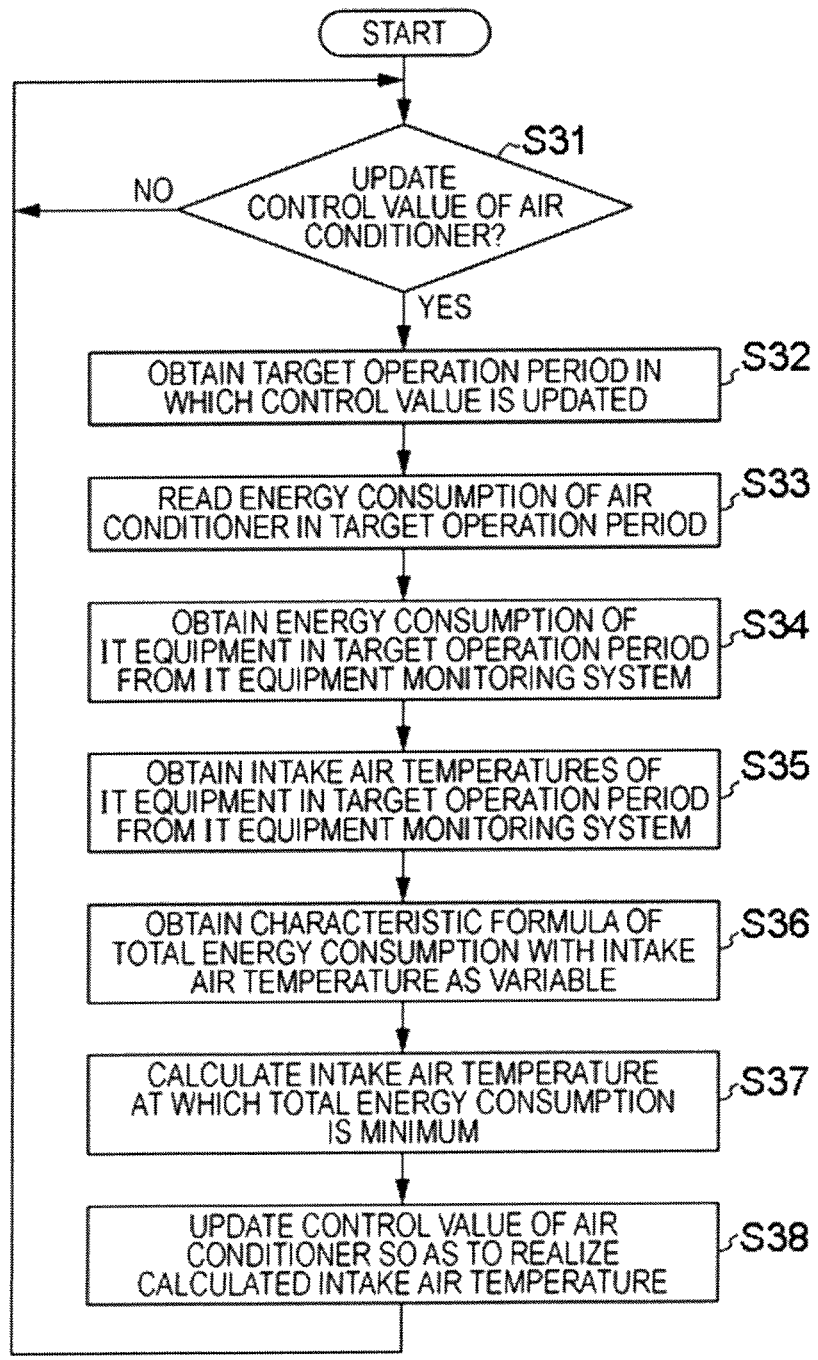

Next, processing of updating a control value of the air conditioners 301A to D will be described with reference to FIG. 6. As illustrated in FIG. 6, the optimal IT equipment intake air temperature calculation function section 220 waits for a timing of updating the control value of the air conditioners 301A to D (step S31).

When it reaches the timing of updating the control value of the air conditioners 301A to D (step S31: Yes), the optimal IT equipment intake air temperature calculation function section 220 obtains a target operation period for which the control value is updated (step S32), and reads energy consumption of the air conditioners 301A to D in the target operation period from the air conditioning energy consumption measurement function section 210 (step S33).

Further, the optimal IT equipment intake air temperature calculation function section 220 obtains energy consumption of the IT equipments 303A to P in the target operation period from the IT equipment monitoring system 100 (step S34), and obtains intake air temperatures of the IT equipments 303A to P in the target operation period from the IT equipment monitoring system 100 (step S35).

The optimal IT equipment intake air temperature calculation function section 220 obtains a characteristic formula which is obtained by approximating the total energy consumption in the datacenter 305 where the air conditioners 301A to D is installed by a quadratic function with an intake air temperature of the IT equipments 303A to P as a variable for the target operation period (step S36). The optimal IT equipment intake air temperature calculation function section 220 obtains an intake air temperature at which the total energy consumption value becomes minimum value by calculating a minimum value of the first derivative formula of the characteristic formula (step S37).

The IT equipment temperature control function section 230 updates the control value of the air conditioners 301A to D so that the intake air temperature calculated by the optimal IT equipment intake air temperature calculation function section 220 is realized (step S38). The optimal IT equipment intake air temperature calculation function section 220 returns again to step S1 described above, and waits for the timing of updating the control value of the air conditioners 301A to D.

When the system is operating, by repeating the above described steps S1 to S8, the optimal IT equipment intake air temperature calculation function section 220 performs the update of the control value of the air conditioners 301A to D. The target operation period for which the control value is updated is a system operation period in which energy consumption for calculating an intake air temperature at which the total energy consumption value becomes minimum value is obtained. For example, a target operation period, such as a period from a previous update of the control value to this time's update of the control value, is set in the optimal IT equipment intake air temperature calculation function section 220 in advance.

As described above, according to the first embodiment, a characteristic formula is obtained by approximating the total energy consumption in the datacenter 305 (energy consumption by the IT equipments 303A to P and energy consumption by the air conditioners 301A to D) by a predetermined function formula with an intake air temperature taken into IT equipments 303A to P as a variable. By using this characteristic formula, an intake air temperature at which the total energy consumption value becomes minimum value is calculated, and the control value of the air conditioning is set so that the calculated intake air temperature is realized.

In this way, by using a correlation (refer to FIG. 2) between the total energy consumption in the datacenter 305 and the intake air temperature of the IT equipments 303A to P and adjusting the intake air temperature of the IT equipments 303A to P, it is possible to control the air conditioning so that the energy efficiency of the entire datacenter 305 including IT equipments 303A to P, air conditioners 301A to D becomes maximum.

In the first embodiment described above, the air conditioning is controlled on the basis of detecting the intake air temperature. However, the controlling method is not limited to this, but the air conditioning may be controlled on the basis of detecting a temperature of air blow from the air conditioners 301A to D.

In addition, the conditioning may be controlled on the basis of the each temperature. Moreover, the conditioning may be controlled on the basis of temperature of outside of the room and the temperature of the intake of the IT equipments 303A to P.

Second Embodiment

In the first embodiment described above, a case is described in which the air conditioning is controlled so that the energy value efficiency of the entire datacenter 305 becomes maximum value by adjusting the intake air temperature of the IT equipments 303A to P. However, the controlling method is not limited to this, but the air conditioning may be controlled to that the energy efficiency of the entire datacenter 305 becomes maximum by adjusting a temperature (blowing temperature) of air blown from the air conditioners 301A to D.

Figure 7:
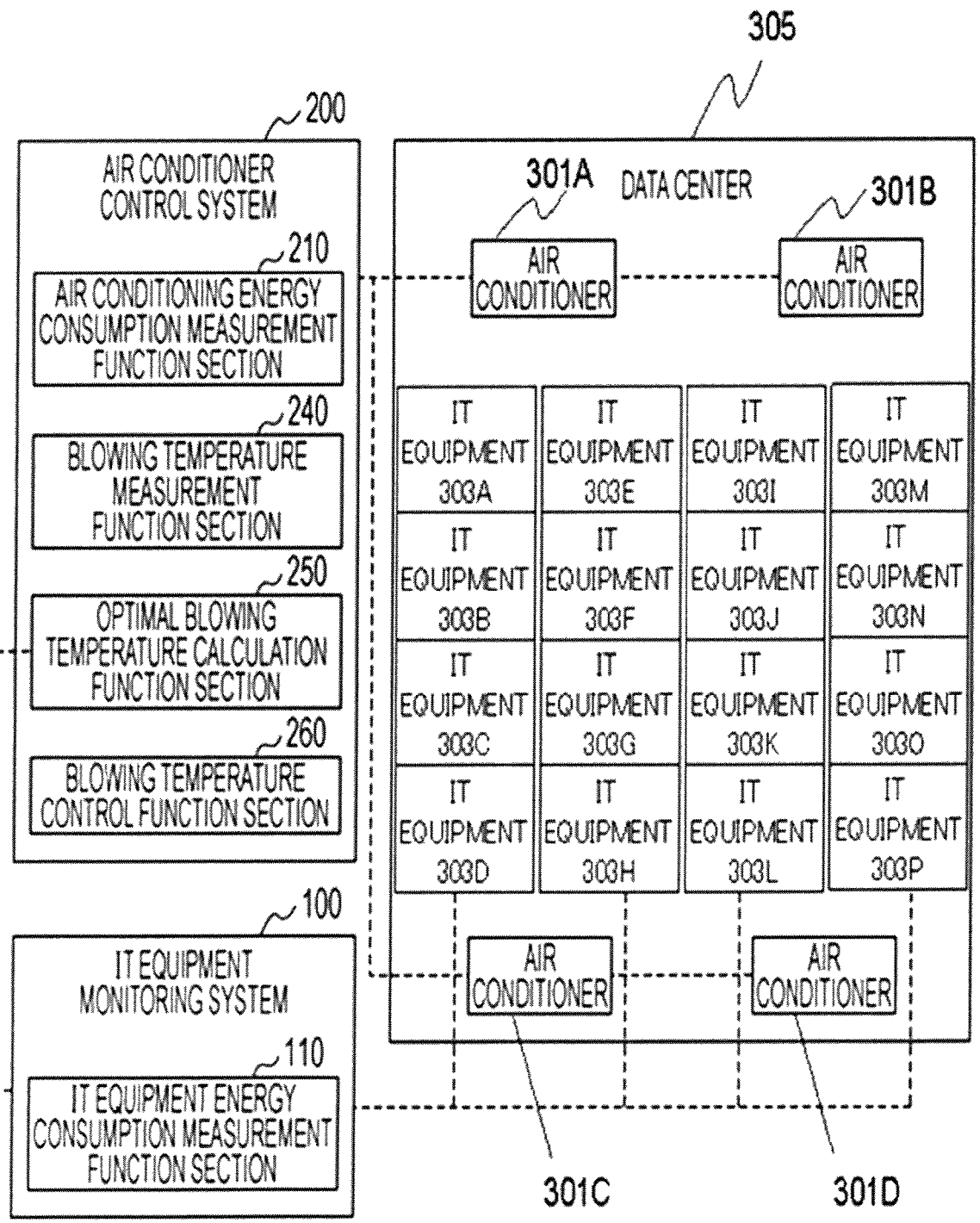
FIG. 7 is a diagram for explaining a configuration of an air conditioning control apparatus according to a second embodiment.

FIG. 7 is a diagram for explaining a configuration of an air conditioning control apparatus according to a second embodiment. As illustrated in FIG. 7, the air conditioning control apparatus 200 further includes the blowing temperature measurement function section 240, the optimal blowing temperature calculation function section 250, and the blowing temperature control function section 260.

The blowing temperature measurement function section 240 measures a blowing temperature of air blown from the air conditioners 301A to D in the datacenter 305. Specifically, the blowing temperature measurement function section 240 obtains a blowing temperature of the air conditioners 301A to D from a detector as a sensor installed in each air conditioners 301A to D in the datacenter 305, and stores the obtained blowing temperature in a storage section included inside the blowing temperature measurement function section 240 or the like.

The optimal blowing temperature calculation function section 250 obtains a characteristic formula which is obtained by approximating the total energy consumption in the datacenter 305 (energy consumption by the IT equipments 303A to P and energy consumption by the air conditioners 301A to D) by a predetermined function formula with a blowing temperature of the air conditioners 301A to D as a variable. By using this characteristic formula, a blowing temperature at which the total energy consumption value becomes minimum value is calculated.

Figure 8:
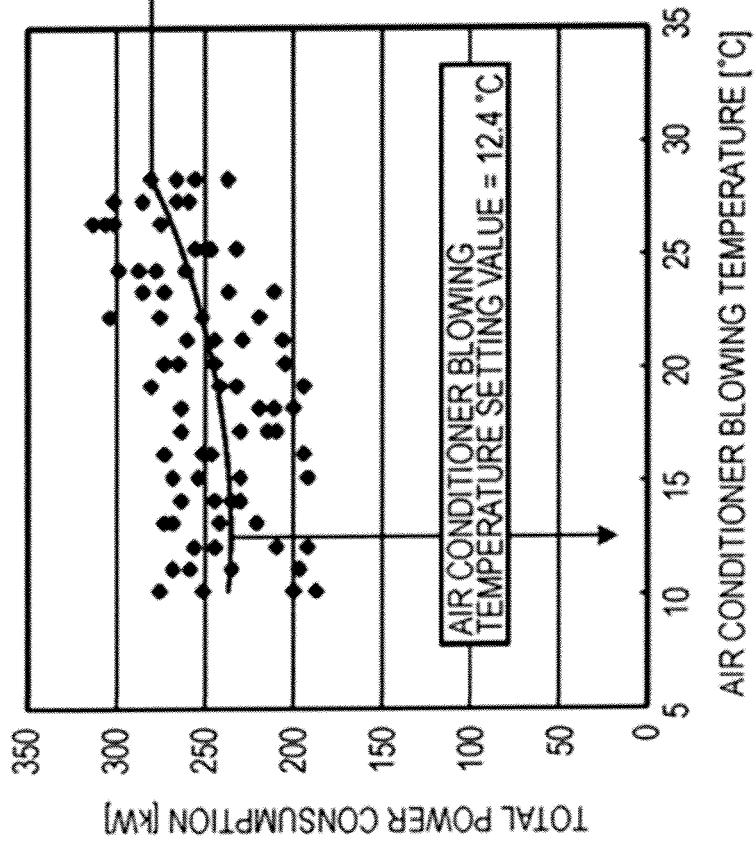
FIG. 8 is a diagram illustrating a relationship between total power consumption (total energy consumption) and a temperature of air blown from a conditioner according to the second embodiment.

For example, as illustrated in FIG. 8, a case in which a quadratic equation having coefficient values "a=0.19, B=−4.71, and c=264.9" and a variable x of blowing temperature "Tac" is employed as a function formula to approximate the total energy consumption will be described below. FIG. 8 is a diagram illustrating a relationship between the total power consumption (total energy consumption) and a blowing temperature of the air conditioners 301A to D according to the second embodiment.

In this case, the optimal blowing temperature calculation function section 250 can obtain a total power (energy) consumption characteristic formula (1) by approximating the total energy consumption in the datacenter 305 where the air conditioners 301A to D is installed by a quadratic function with a blowing temperature as a variable.

Further, the optimal blowing temperature calculation function section 250 can obtain a blowing temperature "Tac=12.4° C." at which the total energy consumption becomes minimum by obtaining a formula (2) that is the first derivative formula of the total power consumption characteristic formula (1) and calculating a minimum value that can be obtained from the formula (2).

The blowing temperature control function section 260 updates the control value of the air conditioners 301A to D so that the blowing temperature calculated by the optimal blowing temperature calculation function section 250 is realized. For example, in a case illustrated in FIG. 8, the blowing temperature control function section 260 updates the control value of the air conditioners 301A to D so that the blowing temperature of the cooling air blown from the air conditioners 301A to D becomes "Tac=12.4° C.".

[Processing of Air Conditioning Control Apparatus (Second Embodiment)]

Figure 9:
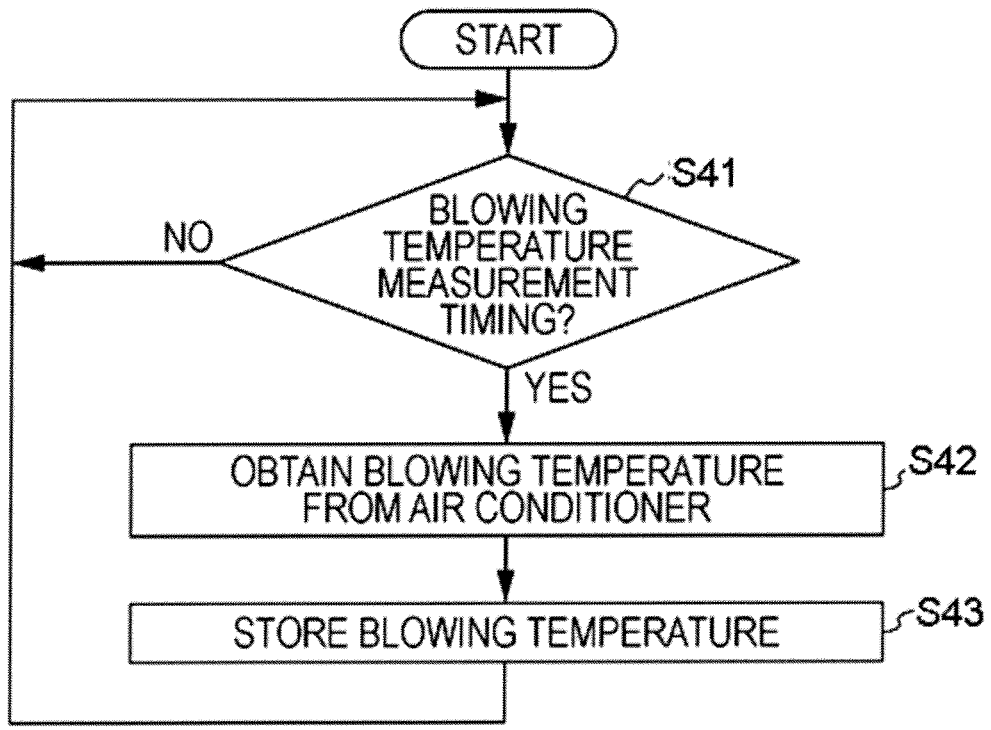
FIGS. 9 and 10 are diagrams illustrating a process flow according to the second embodiment.
Figure 10:
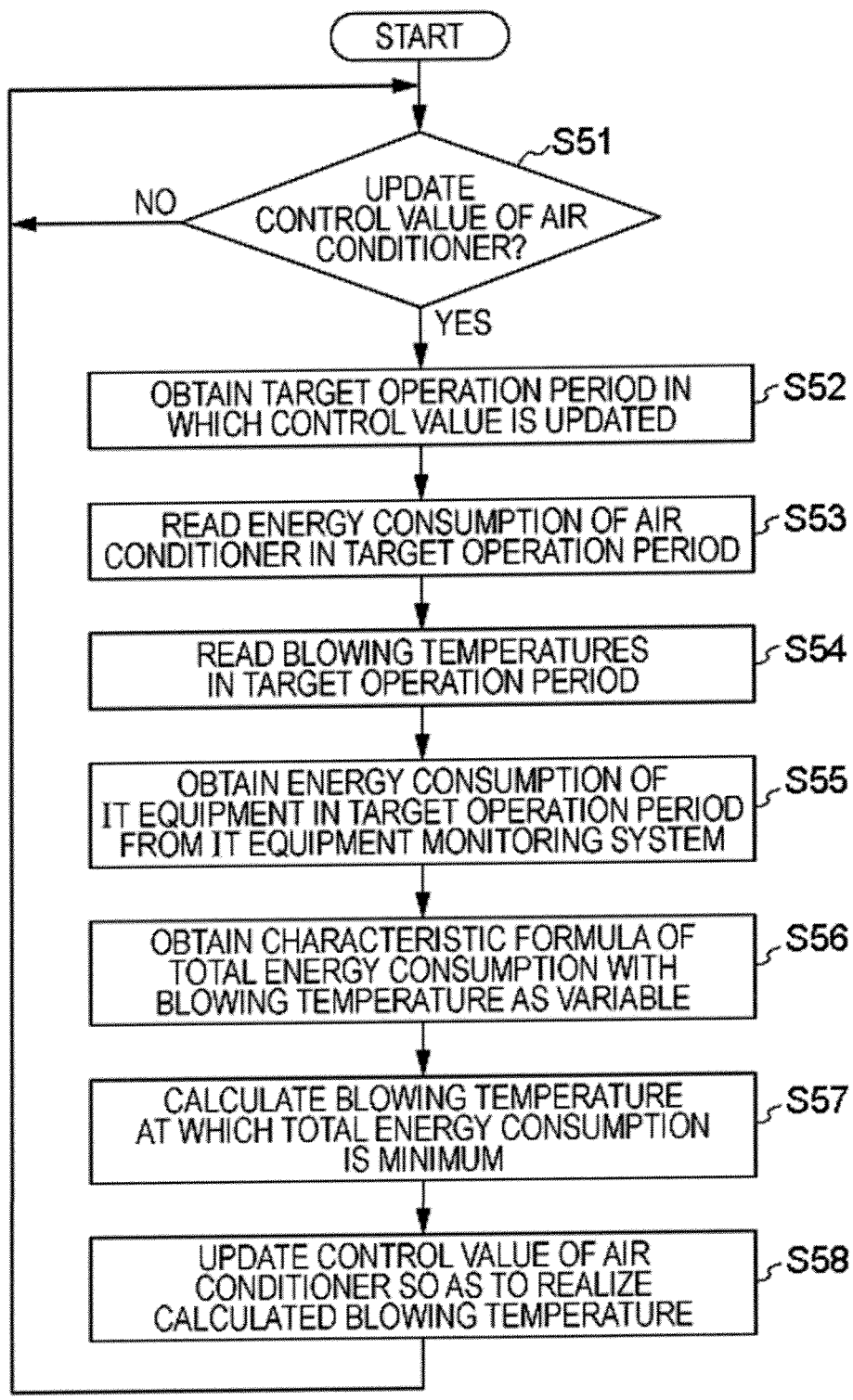

FIGS. 9 and 10 are diagrams illustrating a process flow according to the second embodiment. First, measurement processing of a blowing temperature of the IT equipments 303A to P will be described with reference to FIG. 9. The measurement processing of energy consumption of the IT equipments 303A to P (FIG. 3) and the measurement processing of energy consumption of the air conditioners 301A to D (FIG. 5) are the same as those of the embodiment 1 described above, and thus the descriptions thereof will be omitted.

As illustrated in FIG. 9, the blowing temperature measurement function section 240 waits for a timing of measuring a blowing temperature (step S41). When it reaches the timing of measuring a blowing temperature (step S41: Yes), the blowing temperature measurement function section 240 obtains a blowing temperature of the cooling-air blown from the air conditioners 301A to D from a sensor installed in each air conditioners 301A to D in the datacenter 305 (step S42), and stores the obtained blowing temperature in a storage section included inside the blowing temperature measurement function section 240 or the like (step S43).

After storing the blowing temperature, the blowing temperature measurement function section 240 returns again to step S41 described above, and waits for the timing of measuring a blowing temperature of the air conditioners 301A to D.

When the system is operating, by repeating the above described steps S41 to S43, the blowing temperature measurement function section 240 performs the measurement of a blowing temperature of the air conditioners 301A to D. The timing of measuring a blowing temperature of the air conditioners 301A to D is set to the same as the timing of measuring energy consumption of the air conditioners 301A to D so that the blowing temperature of the air conditioners 301A to D can be associated with the energy consumption of the air conditioners 301A to D.

Next, processing of updating a control value of the air conditioners 301A to D will be described with reference to FIG. 10. As illustrated in FIG. 6, the optimal blowing temperature calculation function section 250 waits for a timing of updating the control value of the air conditioners 301A to D (step S51).

When it reaches the timing of updating the control value of the air conditioners 301A to D (step S51: Yes), the optimal blowing temperature calculation function section 250 obtains a target operation period for which the control value is updated (step S52), and reads energy consumption of the air conditioners 301A to D in the target operation period from the air conditioning energy consumption measurement function section 210 (step S53).

Further, the optimal blowing temperature calculation function section 250 reads blowing temperatures of the air conditioners 301A to D in the target period from the blowing temperature measurement function section 240 (step S54), and obtains intake air temperatures of the IT equipments 303A to P in the target operation period from the IT equipment monitoring system 100 (step S55).

The optimal blowing temperature calculation function section 250 obtains a characteristic formula which is obtained by approximating the total energy consumption in the datacenter 305 where the air conditioners 301A to D is installed by a quadratic function with a blowing temperature of the air conditioners 301A to D as a variable for the target operation period (step S56). The optimal blowing temperature calculation function section 250 obtains a blowing temperature at which the total energy consumption value becomes minimum value by calculating a minimum value of the first derivative formula of the characteristic formula (step S57).

The blowing temperature control function section 260 updates the control value of the air conditioners 301A to D so that the blowing temperature calculated by the optimal blowing temperature calculation function section 250 is realized (step S58). The optimal blowing temperature calculation function section 250 returns again to step S1 described above, and waits for the timing of updating the control value of the air conditioners 301A to D.

As described above, according to the second embodiment, a characteristic formula is obtained by approximating the total energy consumption in the datacenter 305 (energy consumption by the IT equipments 303A to P and energy consumption by the air conditioners 301A to D) by a predetermined function formula with a blowing temperature of cooling air blown from the air conditioners 301A to D as a variable. By using this characteristic formula, a blowing temperature at which the total energy consumption value becomes minimum value is calculated, and the control value of the air conditioning is set so that the calculated blowing temperature is realized.

In this way, by using a correlation (refer to FIG. 8) between the total energy consumption in the datacenter 305 and the blowing temperature of the air conditioners 301A to D and adjusting the blowing temperature of the air conditioners 301A to D, it is possible to control the air conditioning so that the energy efficiency of the entire datacenter 305 including IT equipments 303A to P, air conditioners 301A to D becomes maximum.

However, the controlling method is not limited to this, but the conditioning may be controlled on the basis of temperature of outside of the room and the temperature of the air blow from the air conditioners 301A to D.

(1) Data Used to Calculate Control Value

Although, in the above embodiments, a case is described in which the control value of the air conditioners 301A to D is updated by using naturally occurring measurement data that is measured from IT equipments 303A to P, air conditioners 301A to D, and the like operating in the datacenter 305, the updating method is not limited to this.

For example, it is possible to update the control value of the air conditioners 301A to D by estimating energy consumption of the IT equipments 303A to P and the air conditioners 301A to D using data provided from a manufacturer of the IT equipments 303A to P and a manufacturer of the air conditioners 301A to D, and using the estimated data.

(2) Apparatus Configuration or the Like

Each constituent element of the IT equipment monitoring system 100 and the air conditioning control apparatus 200 illustrated in FIG. 1 is a functional conception, and the constituent elements do not necessarily need to be physically configured as illustrated in the figures. In other words, a specific form of distribution/integration of the air conditioning control apparatus 200 is not limited to the form illustrated in FIG. 1, and for example, the optimal IT equipment intake air temperature calculation function section 220 and the IT equipment temperature control function section 230 are integrated functionally or physically. Or, the IT equipment monitoring system 100 and the air conditioning control apparatus 200 are integrated functionally or physically.

In such a way, all or part of the IT equipment monitoring system 100 and the air conditioning control apparatus 200 can be distributed/integrated functionally or physically by arbitrary units in accordance with various loads and usage situations. Further, all or any part of processing functions (refer to FIGS. 3 to 6 and FIGS. 9 and 10) performed in the air conditioning control apparatus 200 can be realized by a CPU and a program analyzed and executed by the CPU, or can be realized as hardware by wired logic.

(3) Air Conditioning Control Method

The air conditioning control method described below is realized by the IT equipment monitoring system 100 and the air conditioning control apparatus 200 described in the above embodiments.

Specifically, a air conditioning control method is realized, which includes an equipment energy consumption measurement step for obtaining a current value and a voltage value supplied from a power supply apparatus to IT equipments 303A to P and measuring energy consumption of the IT equipments 303A to P from the obtained current value and voltage value (for example, refer to steps S1 to S4 in FIG. 3), a system energy consumption measurement step for obtaining a current value and a voltage value supplied from a power supply section to an air conditioning system and measuring energy consumption of the air conditioning system from the obtained current value and voltage value (for example, refer to steps S21 to S24 in FIG. 5), an intake air temperature measurement step for measuring intake air temperature of the IT equipments 303A to P from a sensor installed in the IT equipments 303A to P (for example, refer to steps S11 to S13 in FIG. 4), an intake air temperature calculation step for calculating an intake air temperature at which the total energy consumption becomes minimum by using a characteristic formula obtained by approximating the total energy consumption that is the sum of the energy consumption of the IT equipments 303A to P measured in the equipment energy consumption measurement step and the energy consumption of the air conditioners 301A to D measured in the system energy consumption measurement step by a predetermined function formula with the intake air temperature measured in the intake air temperature measurement step as a variable (for example, refer to steps S36 and S37 in FIG. 6), and an air conditioning control value setting step for setting a control value of the air conditioning system so that the intake air temperature calculated in the intake air temperature calculation step is realized (for example, refer to step S38 in FIG. 6).

(4) Air Conditioning Control Program

Figure 11:
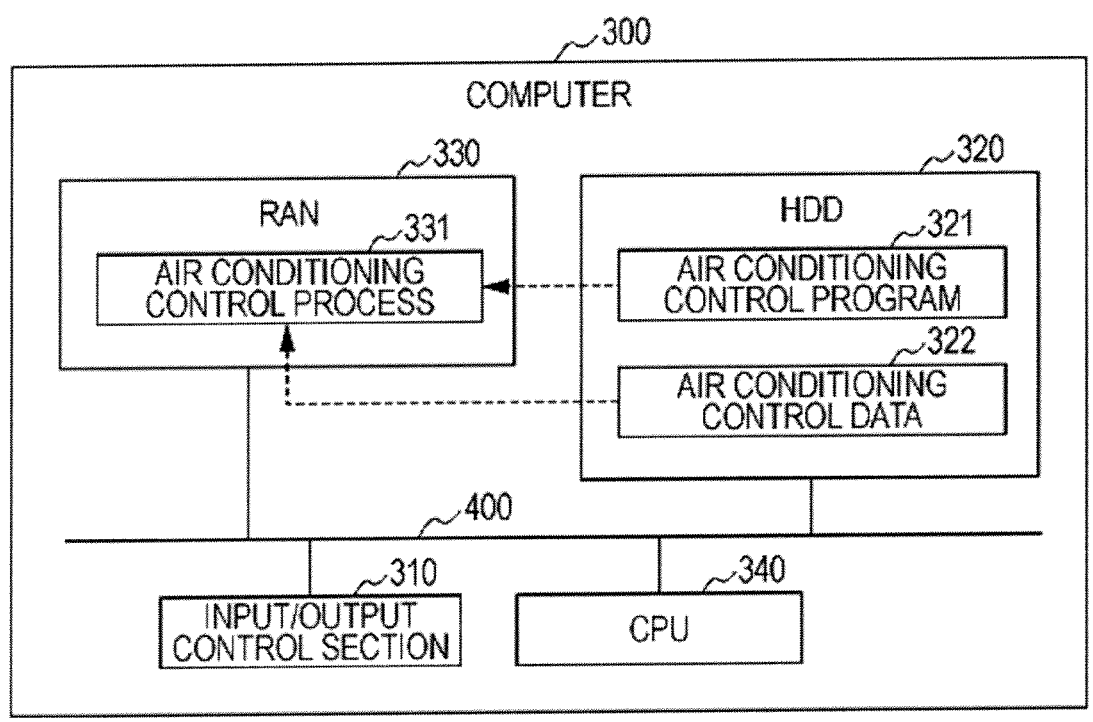
FIG. 11 is a diagram illustrating a computer which executes an air conditioning program.

Various processing (for example, refer to FIG. 6 or the like) of the air conditioning control apparatus 200 described in the above embodiments can also be realized by causing a computer system such as a personal computer and a work station to execute a program prepared in advance. Therefore, hereinafter, an example of a computer which executes an air conditioning program having the same function as that of the air conditioning control apparatus 200 described in the above embodiments will be described with reference to FIG. 11. FIG. 11 is a diagram illustrating the computer which executes the air conditioning program.

As illustrated in FIG. 11, the computer 300 is configured as the air conditioning control apparatus 200 by the input/output control section 310, the HDD 320, the RAM 330, and the CPU 340 which are connected to each other through the bus 400.

The input/output control section 310 controls input/output of various information. The HDD 320 stores information for various processing performed by the CPU 340. The RAM 330 temporarily stores various information. The CPU 340 performs various arithmetic processing.

In the HDD 320, as illustrated in FIG. 11, the air conditioning control program 321 and the air conditioning control data 322 which realize the same functions as those of the function sections of the air conditioning control apparatus 200 illustrated in FIG. 1 are stored in advance. The air conditioning control program 321 can be appropriately distributed and stored in a storage section of another computer communicably connected through a network.

When the CPU 340 reads the air conditioning control program 321 from the HDD 320 and develops the air conditioning control program 321 in the RAM 330, the air conditioning control program 321 functions as the air conditioning control process 331 as illustrated in FIG. 11.

Specifically, the air conditioning control process 331 reads the air conditioning control data 322 from the HDD 320, develops the air conditioning control data 321 in an area assigned to the air conditioning control process 331 in the RAM 330, and performs various processing on the basis of the developed data.

The air conditioning control process 331 corresponds to processing performed by the optimal IT equipment intake air temperature calculation function section 220 in the air conditioning control apparatus 200 illustrated in FIG. 1 and the optimal blowing temperature calculation function section 250 in the air conditioning control apparatus 200 illustrated in FIG. 7.

The air conditioning control program 321 does not necessarily need to be stored in the HDD 320 from the beginning.

For example, programs are stored in a "portable physical medium" such as a flexible disk (FD), a CD-ROM, a DVD disk, a magneto-optical disk, or an IC card inserted in the computer 300. The computer 300 may read the programs from the portable physical medium and execute the programs.

Further, programs are stored in "another computer (or computer)" connected to the computer 300 via a public line, the Internet, LAN, WAN, or the like. The computer 300 may read the programs from the above computer or computer and execute the programs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. An air conditioning control apparatus for controlling an air conditioner in a room which accommodates a computer having an air inlet and having an air outlet, the air conditioning control apparatus comprising:

a memory configured to store a plurality of detected values of power consumption and a plurality of detected values of an air temperature;

a first power detector configured to detect power consumption of the computer;

a second power detector configured to detect power consumption of the air conditioner;

a first temperature detector configured to detect air temperature at the air inlet; and a processor configured to:

obtain repetitively detected values of the power consumption by each of the first power detector and the second power detector and a detected value of the air temperature at the air inlet by the first temperature detector, store the obtained values into the memory, determine an approximate expression representing a relation between the total power consumption of the computer and the air conditioner and the air temperature at the air inlet on the basis of the obtained values stored into the memory, determine a value of the air temperature at the air inlet corresponding to the lowest value of the total power consumption, by using the determined approximate expression so that the detected air temperature at the air inlet is lower than a temperature at an air inlet of a computer accommodated in a room having a conventional air conditioner, and control the air conditioner so that the air temperature at the air inlet becomes equal to the determined value of the air temperature at the air inlet.

2. The air conditioning control apparatus according to claim 1, wherein
the processor is configured to determine repetitively the approximate expression and the value of the air temperature at the air inlet.

3. The air conditioning control apparatus according to claim 2, wherein
the processor is configured to determine regularly the approximate expression and the value of the air temperature at the air inlet.

4. The air conditioning control apparatus according to claim 2, wherein
the processor is configured to determine the approximate expression and the value of the air temperature at the air inlet when obtaining the detected values.

5. The air conditioning control apparatus according to claim 1,
further comprising a second temperature detector configured to detect air temperature at a vent of the air conditioner;
wherein the processor is configured to obtain the detected values of the power consumptions and a detected value of the air temperature by each of the first temperature detector and the second temperature detector, and
the processor is configured to determine an approximate expression representing a relation between the total power consumption of the computer and the air conditioner and each detected value of the air temperature at the air inlet and at the vent of the air conditioner on the basis of the obtained values stored into the memory.

6. The air conditioning control apparatus according to claim 1,
further comprising a third temperature detector is configured to detect an air temperature at an outside of the room;
wherein the processor is configured to obtain the detected values of the power consumptions and a detected value of the air temperature by each of the first temperature detector and the third temperature detector, and
the processor is configured to determine an approximate expression representing a relation between the total power consumption of the computer and the air conditioner and each detected value of the air temperature at the air inlet and at the outside of the room on the basis of the obtained values stored into the memory.

7. The air conditioning control apparatus according to claim 1, further comprising a blowing temperature control section configured to control a temperature at an outlet of the air conditioner so that the temperature at the outlet of the air conditioner becomes equal to the determined value calculated by an optimal blowing temperature calculation section by using the approximate expression representing the relation between the total power consumption of the computer and the air conditioner and the air temperature at the air outlet of the air conditioner.

8. An air conditioning control method for controlling an air conditioner in a room which accommodates a computer having an air inlet and having an air outlet by using a controller, the controller including a memory; the air conditioning control method comprising:
obtaining repetitively detected values of a power consumption by each of a first power detector and a second power detector and a detected value of an air temperature by a first temperature detector, the first power detector detecting the power consumption of the computer, the second power detector detecting the power consumption of the air conditioner, the first temperature detector detecting air temperature at the air inlet;
storing the obtained values into the memory;
determining an approximate expression representing a relation between the total power consumption of the computer and the air conditioner and the air temperature at the air inlet on the basis of the obtained values stored into the memory;
determining a value of the air temperature at the air inlet corresponding to the lowest value of the total power consumption, by using the calculated approximate expression so that the detected air temperature at the air inlet is lower than a temperature at an air inlet of a computer accommodated in a room having a conventional air conditioner; and
controlling the air conditioner so that the air temperature at the air inlet becomes equal to the calculated air temperature at the air inlet.

9. A non-transitory computer-readable recording medium storing a computer program controlling an air conditioner in a room which accommodates IT equipment having an air inlet and having an air outlet, and a computer having a memory; the computer program comprising code that, when executed by the computer, causes the computer to:
obtain repetitively detected values of a power consumption by each of a first power detector and a second power detector and a detected value of an air temperature by a first temperature detector, the first power detector detecting the power consumption of the IT equipment, the second power detector detecting the power consumption of the air conditioner, the first temperature detector detecting air temperature at the air inlet;
store the obtained values into the memory;
determine an approximate expression representing a relation between the total power consumption of the computer and the air conditioner and the air temperature at the air inlet on the basis of the obtained values stored into the memory;
determine a value of the air temperature at the air inlet corresponding to the lowest value of the total power consumption, by using the calculated approximate expression so that the detected air temperature at the air inlet is lower than a temperature at an air inlet of a computer accommodated in a room having a conventional air conditioner; and
control the air conditioner so that the air temperature at the air inlet becomes equal to the calculated air temperature at the air inlet.

* * * * *